United States Patent
Yu et al.

(10) Patent No.: US 11,626,577 B2
(45) Date of Patent: Apr. 11, 2023

(54) ORGANIC LIGHT-EMITTING DIODE (OLED) DISPLAY DEVICES WITH MIRROR AND METHOD FOR MAKING THE SAME

(71) Applicant: Applied Materials, Inc., Santa Clara, CA (US)

(72) Inventors: Gang Yu, Santa Barbara, CA (US); Chung-Chia Chen, New Taipei (TW); Wan-Yu Lin, Taipei (TW); Hyunsung Bang, Aschaffenburg (DE); Lisong Xu, San Jose, CA (US); Byung Sung Kwak, Portland, OR (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 49 days.

(21) Appl. No.: 17/152,692

(22) Filed: Jan. 19, 2021

(65) Prior Publication Data

US 2021/0226169 A1    Jul. 22, 2021

Related U.S. Application Data

(60) Provisional application No. 62/964,633, filed on Jan. 22, 2020.

(51) Int. Cl.
*H01L 51/52* (2006.01)
*H01L 51/56* (2006.01)
*H01L 27/32* (2006.01)

(52) U.S. Cl.
CPC ...... *H01L 51/5271* (2013.01); *H01L 27/3246* (2013.01); *H01L 51/56* (2013.01); *H01L 2251/5315* (2013.01)

(58) Field of Classification Search
None
See application file for complete search history.

(56) References Cited

U.S. PATENT DOCUMENTS

| 6,476,988 B1 | 11/2002 | Yudasaka |
| 8,227,269 B2 | 7/2012 | Chen et al. |

(Continued)

FOREIGN PATENT DOCUMENTS

| CN | 110212004 | 9/2019 |
| JP | 2001-196644 | 7/2001 |

(Continued)

OTHER PUBLICATIONS

International Search Report and Written Opinion in International Appln. No. PCT/US2021/014012, dated May 12, 2021, 7 pages.

(Continued)

*Primary Examiner* — Michelle Mandala
(74) *Attorney, Agent, or Firm* — Fish & Richardson P.C.

(57) ABSTRACT

An organic light-emitting diode (OLED) device includes a substrate, a well structure on the substrate with the well structure having a recess with side walls and a floor, a lower metal layer covering the floor and side-walls of the well, an upper conductive layer on the lower metal layer covering the floor of the well and contacting the lower metal layer, the upper conductive layer having outer edges at about an intersection of the side walls and the floor, a dielectric layer formed of an oxide of the lower metal layer covering the side walls of the well without covering the upper conductive layer, a stack of OLED layers covering at least the floor of the well, the upper conductive layer providing an electrode for the stack of OLED layers, and a light extraction layer (LEL) in the well over the stack of OLED layers and the dielectric layer.

17 Claims, 9 Drawing Sheets

(56) References Cited

U.S. PATENT DOCUMENTS

| | | |
|---|---|---|
| 8,323,748 B2 | 12/2012 | Ling |
| 8,425,065 B2 | 4/2013 | Ravillisetty et al. |
| 9,099,575 B2 | 8/2015 | Medendorp, Jr. et al. |
| 9,111,464 B2 | 8/2015 | Bibl et al. |
| 9,224,978 B2 | 12/2015 | Jung et al. |
| 9,536,931 B2 | 1/2017 | Kim et al. |
| 10,978,640 B2* | 4/2021 | Li .................. H01L 51/5296 |
| 11,355,724 B2 | 6/2022 | Yu et al. |
| 2003/0222267 A1 | 12/2003 | Kim et al. |
| 2005/0258441 A1 | 11/2005 | Shitagami |
| 2007/0217019 A1 | 9/2007 | Huang et al. |
| 2010/0013741 A1 | 1/2010 | Watanabe |
| 2010/0045575 A1 | 2/2010 | Kim |
| 2010/0110551 A1 | 5/2010 | Lamansky et al. |
| 2010/0117106 A1 | 5/2010 | Trottier |
| 2010/0124603 A1 | 5/2010 | Ito et al. |
| 2010/0295077 A1 | 12/2010 | Melman |
| 2011/0086232 A1 | 4/2011 | Sharma |
| 2012/0183690 A1 | 7/2012 | Titulaer |
| 2013/0116108 A1 | 5/2013 | Cassingham et al. |
| 2013/0126842 A1 | 5/2013 | Takeuchi et al. |
| 2013/0140982 A1 | 6/2013 | Park |
| 2013/0181235 A1 | 7/2013 | Kang et al. |
| 2015/0084008 A1* | 3/2015 | Park .................. H01L 27/3276 438/34 |
| 2015/0123086 A1 | 5/2015 | Lee et al. |
| 2016/0268320 A1* | 9/2016 | Long .................. H01L 27/124 |
| 2016/0268554 A1* | 9/2016 | Wu .................... H01L 27/32 |
| 2017/0077448 A1 | 3/2017 | Sakamoto et al. |
| 2017/0358779 A1 | 12/2017 | Wu et al. |
| 2018/0269414 A1 | 9/2018 | Bando |
| 2018/0315805 A1* | 11/2018 | Liu .................... H01L 27/3272 |
| 2018/0358580 A1 | 12/2018 | Kim et al. |
| 2019/0058025 A1 | 2/2019 | Huang et al. |
| 2019/0067394 A1 | 2/2019 | Cheon et al. |
| 2019/0103588 A1 | 4/2019 | Jiang et al. |
| 2019/0131567 A1 | 5/2019 | Li |
| 2019/0131568 A1 | 5/2019 | Li |
| 2019/0181188 A1 | 6/2019 | Youn et al. |
| 2019/0207155 A1 | 7/2019 | Lee |
| 2019/0305002 A1* | 10/2019 | Zhou ................. H01L 29/41733 |
| 2021/0135140 A1 | 5/2021 | Yu et al. |
| 2022/0037432 A1 | 2/2022 | Xu et al. |
| 2022/0293878 A1 | 9/2022 | Yu et al. |

FOREIGN PATENT DOCUMENTS

| | | |
|---|---|---|
| KR | 10-2010-0066416 | 6/2010 |
| KR | 10-2011-0061317 | 6/2011 |
| KR | 10-1319306 | 10/2013 |
| KR | 10-2015-0052490 | 5/2015 |
| KR | 10-1900954 | 9/2018 |
| KR | 10-2019-0068102 | 6/2019 |

OTHER PUBLICATIONS

International Search Report and Written Opinion in International Appln. No. PCT/US2020/058736, dated Feb. 26, 2021, 11 pages.

Zou et al., "A Highly Hydrophilic and Biodegradable Novel Poly (annide-imide) for Biomedical Applications," Polymers, 2016, 8:441.

* cited by examiner

ORGANIC LIGHT-EMITTING DIODE (OLED) DISPLAY DEVICES WITH MIRROR AND METHOD FOR MAKING THE SAME

CROSS-REFERENCE TO RELATED APPLICATIONS

This application claims priority to U.S. Application Ser. No. 62/964,633, filed on Jan. 22, 2020, the disclosure of which is incorporated by reference.

TECHNICAL FIELD

The present disclosure relates to fabrication of organic light-emitting diode (OLED) display devices.

BACKGROUND

An organic light-emitting diode (OLED or Organic LED), also known as an organic EL (organic electroluminescent) diode, is a light-emitting diode (LED) in which the emissive electroluminescent layer is a film of organic compound that emits light in response to an electric current. This organic layer is situated between two electrodes; typically, at least one of these electrodes is transparent. OLEDs are used to create digital displays in devices such as television screens, computer monitors, portable systems such as smartwatches, smartphones, handheld game consoles, PDAs, and laptops.

An OLED display can be driven with a passive-matrix (PMOLED) or active-matrix (AMOLED) control schemes. In the PMOLED scheme, each row (and line) in the display is controlled sequentially, one by one, whereas AMOLED control uses a thin-film transistor backplane to directly access and switch each individual pixel on or off, allowing for faster response, higher resolution, and larger display sizes.

AMOLED displays are attractive for high pixel density, superior image quality, and thin form factor in comparison to conventional LCD displays. AMOLED displays are self-emissive devices that can be made with thin film process, on thin and flexible substrates, and do not require backlights as used in LCD displays. In addition to superior power efficiency over LCD devices, AMOLED devices are noted for features such as "Consuming-Power-only-when-Lighting-Up," and "Consuming-only-the-needed-Power-Corresponding-to-the-Emitting-Intensity". AMOLED displays have thus been viewed as an attractive display technology for battery powered portable products.

SUMMARY

In one aspect, a method for manufacturing an organic light-emitting diode (OLED) structure includes depositing a metal stack including a lower metal layer and an upper metal layer over a well structure that defines a pixel of the OLED structure on a substrate, performing a lithography process using a two-tone mask to form a two-tone photoresist layer on the metal stack, removing portions of the photoresist layer having a first tone to expose regions of the metal stack outside the well structure, removing portions of the metal stack outside the well structure using the photoresist layer as a mask, removing portions of the photoresist layer having a second tone to expose regions of the metal stack correspond to sidewalls of the well structure, removing portions of the upper metal layer on the sidewalls of the well structure while preserving the upper metal layer over areas corresponding to the bottom of the well structure using the photoresist layer as a mask, and oxidizing at least one exposed surface such that a lower electrode is created in the areas that correspond to the bottom of the well structure and a dielectric passivation layer is created in an area that corresponds to the sidewalls.

Implementations may include one or more of the following features. The lower metal layer may provide a mirror on the sidewalls. Each lower electrode may be created over a metal electrode of a thin film transistor (TFT) driver for a pixel of the OLED structure. The lower metal layer may be aluminum, AlNd, or an aluminum alloy. The lower metal layer may include In, Zn, Ti, Ta, Sn, Mo, Ni, Nb, Cu, Mg or a metal alloy thereof. Depositing the metal stack may include a sputtering process.

In another aspect, an organic light-emitting diode (OLED) device to provide a pixel of a display includes a substrate, a well structure on the substrate with the well structure having a recess with side walls and a floor, a stack of OLED layers covering at least the floor of the well, and a light extraction layer (LEL) in the well over the stack of OLED layers. The pixel is dimensionally defined by mirrors on the sidewall, and the mirrors on the sidewalls have an outer dimension within 8 um such that an OLED device based on the OLED pixel has more than 1000 pixels per inch (PPI).

In another aspect, an organic light-emitting diode (OLED) device to provide a pixel of a display includes a substrate, a well structure on the substrate with the well structure having a recess with side walls and a floor, a lower metal layer covering the floor and side-walls of the well, an upper conductive layer on the lower metal layer covering the floor of the well and contacting the lower metal layer, the upper conductive layer having outer edges at about an intersection of the side walls and the floor, a dielectric layer formed of an oxide of the lower metal layer covering the side walls of the well without covering the upper conductive layer, a stack of OLED layers covering at least the floor of the well, the upper conductive layer providing an electrode for the stack of OLED layers, and a light extraction layer (LEL) in the well over the stack of OLED layers and the dielectric layer.

Advantages may include, but are not limited to, one or more of the following.

To achieve OLED displays with improved external light efficiency, two more lithography patterning process steps may be needed for fabricating a lower electrode and a surrounding mirror in a top emission OLED device. The fabrication process may be simplified by using a single deposition and lithography patterning step to achieve the reflective lower pixel electrode and the mirror surrounding it. The dielectric coating over the mirror area may be based upon surface oxidation of the metal mirror underneath with optical index matching to that of the OLED stack layers sandwiched between the upper and lower electrode. The self-alignment nature of the method may eliminate a photolithography process (and thus the associated loss of yield on mask alignment and etching). The self-aligned structures and methods described in the present disclosure enable the concave wells be made with small dimension, thus allowing OLED displays to operate with higher pixel densities.

The details of one or more aspects of the subject matter described in this specification are set forth in the accompanying drawings and the description below. Other features, aspects, and advantages will become apparent from the description, the drawings, and the claims.

BRIEF DESCRIPTION OF THE DRAWINGS

Like reference symbols in the various drawings indicate like elements.

DETAILED DESCRIPTION

An OLED is a two-terminal thin film device with a stack of organic layers including a light emitting organic layer sandwiched between two electrodes. At least one of the electrodes is transparent, thus allowing the emitted light to pass through. Typically, an encapsulation or passivation covers the OLED stack. Due to mismatch of optic parameters in the OLED stack and the encapsulation or passivation layer thereon, significant efficiency loss can occur. In addition, in a conventional device configuration with a stack of planar layers, significant light can be absorbed by the support substrate or escape at low angles.

An internal quantum efficiency (IQE) quantifies the ratio of the number of converted photons and the number of input electrons whereas the external quantum efficiency (EQE) indicates the ratio of number of emitted and extracted photons that have been converted from the number of input electrons. In this context, even though IQE can be almost perfect, EQE can be far from ideal because significant amount of emitting light can be trapped inside the OLED display or waveguided along horizontal direction (in parallel to the substrate). In one example, even with ideal IQE (e.g., about 100% for phosphorescent materials), an EQE of about 20 to 25% has been realized in commercial OLED with conventional device configurations. In addition to optical energy loss to output emission, the light trapped inside can also be waveguided to neighbor pixels and can be scattered into front view, causing "light leakage" or "optical crosstalk", and reducing display sharpness and contrast.

Figure 1A:
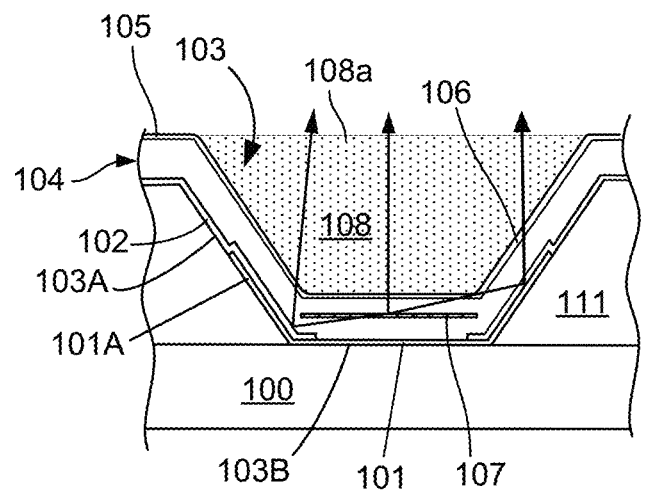
FIGS. 1A to 1B show examples of cross-sectional views of a top emission OLED pixel with a patterned/structured light extraction layer of index matching material.
Figure 1B:
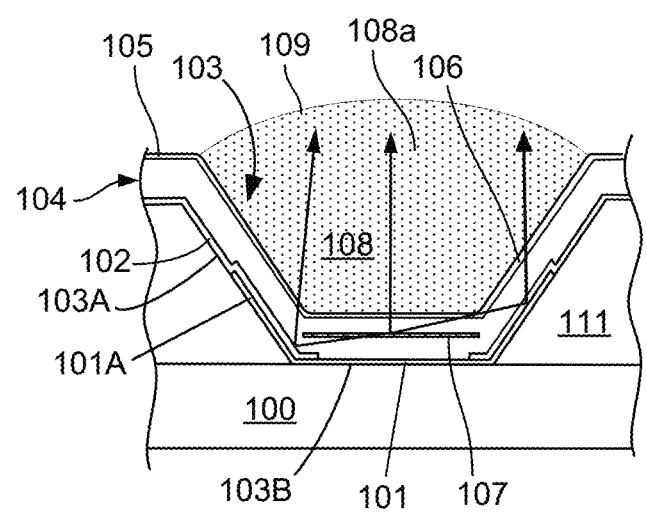
Figure 1C:
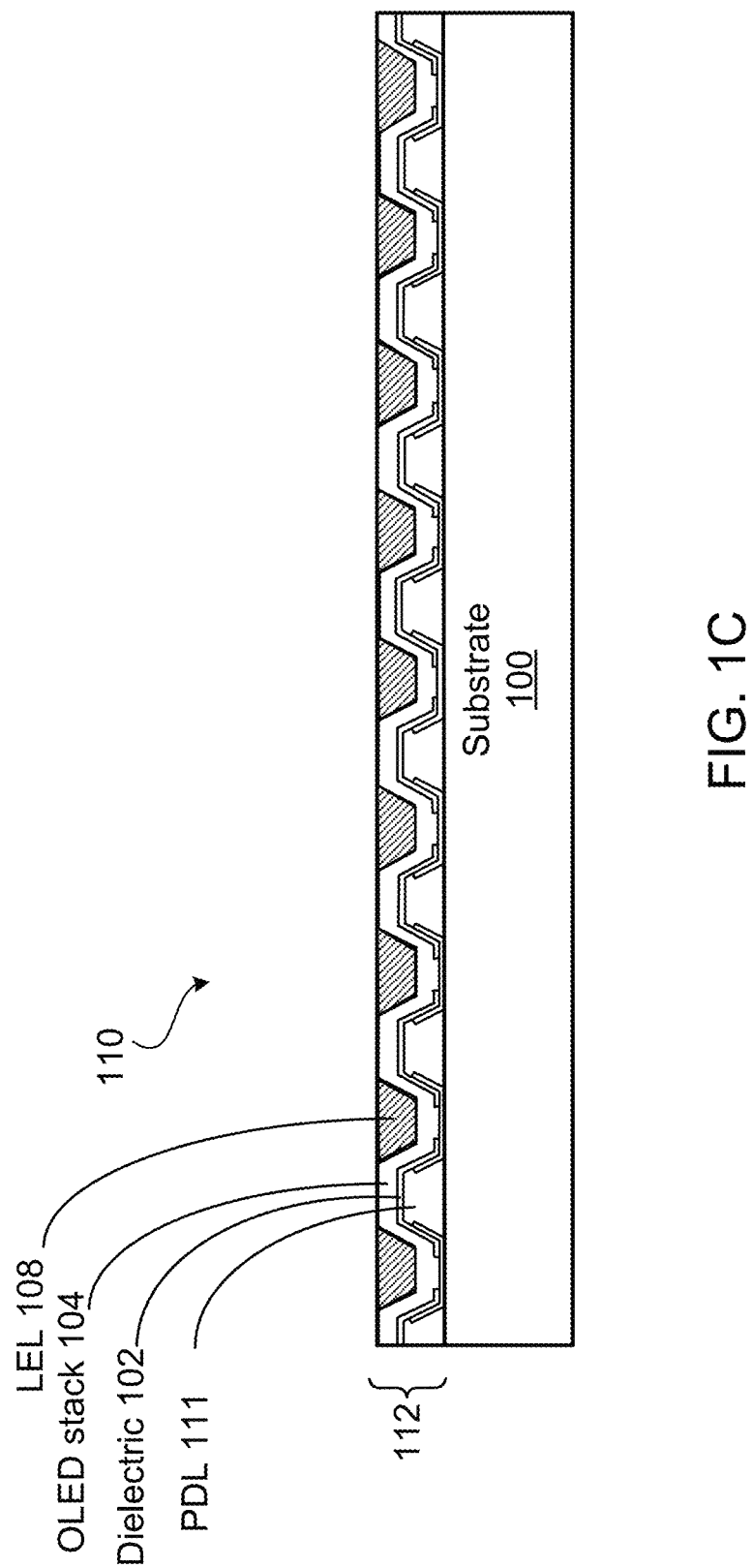
FIG. 1C shows an example of a cross-sectional view of an array of top emission OLED pixels with the patterned/structured light extraction layer of index matching material.

Referring to FIGS. 1A to 1C, one solution to this problem is to form the OLED stack in a well structure 103, with mirrors along the bottom 103B and portions of the oblique sidewalls 103A of the well and a patterned light extraction layer 108 filling the well. Examples of a top-emitting OLED structure are shown in FIGS. 1A and 1B. The OLED structure is formed on a support substrate 100, which optionally can be removed following the fabrication process.

The well can be provided by a recess in a dielectric pixel defining layer (PDL) 111 that is disposed over the support substrate 100. The pixel defining layer (PDL) 111 can be formed after a pixel driving circuit made with one or more thin film transistors (TFTs) is formed on the substrate 100. The PDL 111 can be a polymeric material, e.g., can be formed by depositing a layer of photoresist material. The layer of polymeric material is then selectively patterned to form recesses that will provide the wells. The top surface PDL provides a plateau that separates the individual OLED subpixels within the devices.

A conductive anode 101 is formed at the bottom 103B of or below the well structure 103. The anode 101 can extend up a portion of the oblique side walls 103A of the well. The anode 101 can be silver and/or another reflective conductive material, or can be from a conductive non-reflective material that is coated with a conductive optically reflective material. In some implementations, the anode 101 is sufficiently reflective to serve as a mirror.

The anode 101 can be processed before the PDL 111 and formed after a thin film transistor (TFT) is formed on substrate 100. For example, the thin film transistor can include conductive terminals for the gate, drain and source regions of the transistor. Here, the anode 101 can be disposed over the TFT and arranged in electrical contact with the drain of the TFT by, for example, conductive vias through a dielectric layer.

As illustrated in FIGS. 1A and 1B, the anode 101 can be formed after the pixel defining layer (PDL) 111 is deposited and patterned. A portion of the anode 101 can extend partially or fully up the oblique sidewalls 103A into the region of the PDL slope, for example, e.g., in area 101A. Thus, the anode 101 is spaced from the top of the recess (i.e., the top of the plateau). As a result, the mirror provided by the anode 101 can extend partially or fully up the oblique sidewalls 103A.

Alternatively, the anode 101 can be deposited before the PDL 111. A portion of the anode 101 can extend below the pixel defining layer (PDL) 111. For example, the anode 101 can be deposited only in the area of the flat bottom region 103B. In this case, a separate mirror layer can be formed that covers the bottom 103B of the well and extends partially or fully up the oblique sidewalls 103A.

Assuming the anode 101 is formed over the PDL 111, a transparent dielectric layer 102 can be formed over a portion of the anode 101 and over exposed portions of the PDL 111. The aperture in the dielectric layer 102 will define an emission area for the OLED. The dielectric layer 102 can be formed using photoresist type of material. As illustrated, the dielectric layer 102 can cover the anode 101 at the outer edge of the bottom 103B of the well and on the oblique sidewalls 103A. But otherwise, extension of the dielectric layer 102 into the bottom 103B of the well is generally minimized.

An OLED layer stack 104 that includes a light emission zone 107 is formed over the anode 101. The OLED layer stack 104, for example, in a top emitting OLED stack, can include an electron injection layer (EIL), an electron transport layer, a hole blocking layer, a light emissive layer (EML), an electron blocking layer (EBL), a hole transport layer (HTL), and a hole injection layer (HIL), although this is just one possible set of layers. The lowest layer of the OLED stack 104 is in electrical contact with the anode 101, either directly or through a conductive mirror layer disposed on the anode. The portion of the light emissive layer (EML) above the region of the anode 101 exposed through the aperture in the dielectric layer 102 can provide the light emission zone 107.

Another transparent electrode 106, e.g., the cathode, can be formed over the OLED stack 104. The top layer of the OLED stack 104 is in electrical contact with the cathode 106.

A capping layer (CPL) can be placed on top of the cathode 106. CPLs are typically organic materials similar to non-EML OLED layers. A passivation layer can be deposited on the CPL layer.

The electrode 106 can be a continuous layer covering the entire display and connecting to all pixels. In comparison, the anode 101 is not made continuous so that independent control of each OLED can be achieved. This permits sub-pixel control; each pixel can include three subpixels of different colors, e.g., R, G, and B.

In implementations in which the anode 101 serves as sidewall mirrors (e.g., deposited along the slopes of the PDL), the emission area can be further controlled by placing the dielectric layer 102 over such sidewall mirrors. The extent of the dielectric layer 102 can be varied. In general, OLED emission is highly dependent on layer thicknesses. The dielectric layer 102 allows suppression of emission from the OLED structure formed on the sidewalls (during device fabrication) where the thickness differences between sidewall and bottom of the well can result in inconsistent emission characteristics, including emission spectra and color coordinates.

The OLED structure further has an index-matching filling material 108 disposed inside the concave area of well structure 103. The top surface 108a of the index-matching filling material/layer can be flat (see FIG. 1A) or curved/non-planar (see FIG. 1B). Through a proper device design, by introducing the mirror around the OLED emission zone and the light extraction layer (through index-matching material in the concavity), EQE can be improved by a factor of 2-3 from the conventional OLED design. As a result, the power consumption of an OLED display in portable applications can be reduced by a commensurate factor of 2 to 3, which allows using a smaller, lighter weight rechargeable battery and achieves faster charging time than that used in the current mobile devices such as touch-screen phones, pads, and laptops. In a similar vein, the same mobile device with high efficient OLED display can run a much longer time (for example, slightly less than a factor of 2-3) on a single charge of the original battery. Another benefit of such highly efficient pixel architecture is longer lifetime of the devices as the pixels will achieve desired brightness with lower current and voltage, which leads to lower degradation phenomena. Yet another benefit is the technical feasibility of achieving higher pixel density as the higher EQE enables smaller emitting area to achieve the same brightness as before.

However, the newly added light extraction layer (LEL) may not be manufacturable at a commercially viable price using conventional techniques. This added layer calls for additional processes and corresponding tools. In particular, it would be desirable to deposit the filler layer using droplet ejection techniques, e.g., a 3D printing techniques using droplet ejection. The liquid material to be ejected as droplets is often called an "ink", although it need not (and typically would not) include pigmentation.

One type of filling "ink" promising for the LEL is a solution including organometallic molecules or metal-oxide nano-particles with or without surface passivated with organic linking units (named "MO ink" in more detail below). This type of filling ink has high solid loading (e.g., high percentage ratio of forming solid/ink volume which may be in slurry mixture) and tunable dielectric constant to potentially maximize the output emission. The curing method involves exposing the filling inks to UV radiation along with a duration of post annealing time at an elevated temperature. Unfortunately, UV exposure dose required for curing of the LEL precursor material can be harmful to the OLED structure underneath.

To address the manufacturing challenge caused by the UV-curing ink for the index matching material of the light extracting layer (LEL), the present disclosure proposes solutions that introduces a UV-blocking layer underneath the LEL layer so that UV-curable inks can be adopted for the patterned LEL layer without compromising the performance of the OLED stack underneath. Both organic and inorganic materials can be used for the UV-blocking layer.

In addition, an appropriate surface profile or a hydrophobic surface can be provided that enables mis-aligned ink droplets during manufacturing to fall back into the well by means of gravity and the surface property of the top of the dome (as discussed in further detail in FIG. 4B below). These techniques can be used in conjunction with or independent of the UV-blocking layer deposited over the OLED stack (as discussed in further detail in FIGS. 2A and 2B below).

Moreover, with the inkjet process of the present disclosure, a patterned LEL layer can be formed with a gradient in the index of refraction. The inkjet printing or slot-die coating with multiple coating steps enables the patterned LEL with gradient index and with integration with the covering glass (or touch panel in on-cell touch configuration).

FIG. 1C shows the cross-sectional view of an array 110 of OLED pixels arranged in a layered structure 112 on substrate 100.

Figure 2A:
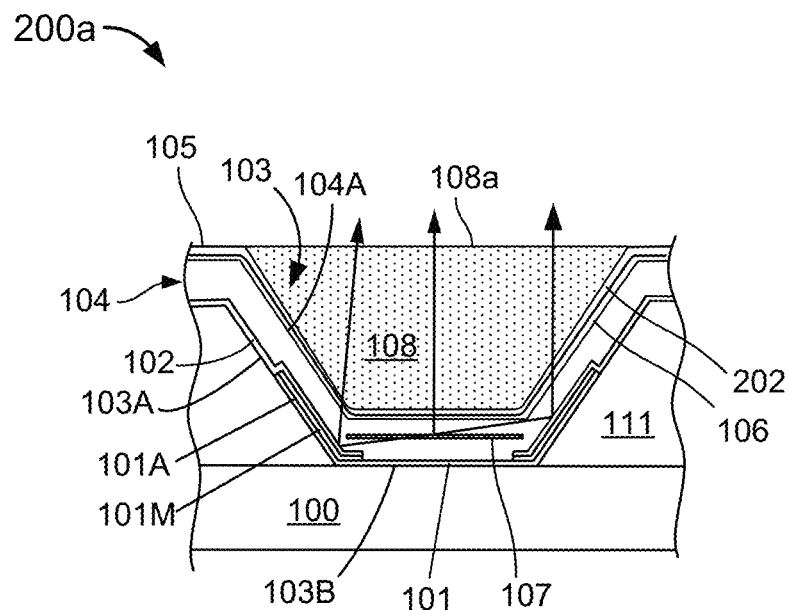
FIG. 2A shows an example of a cross-sectional view of a top emission OLED pixel with an UV-Blocking layer underneath the patterned/structured light extraction layer.
Figure 2B:
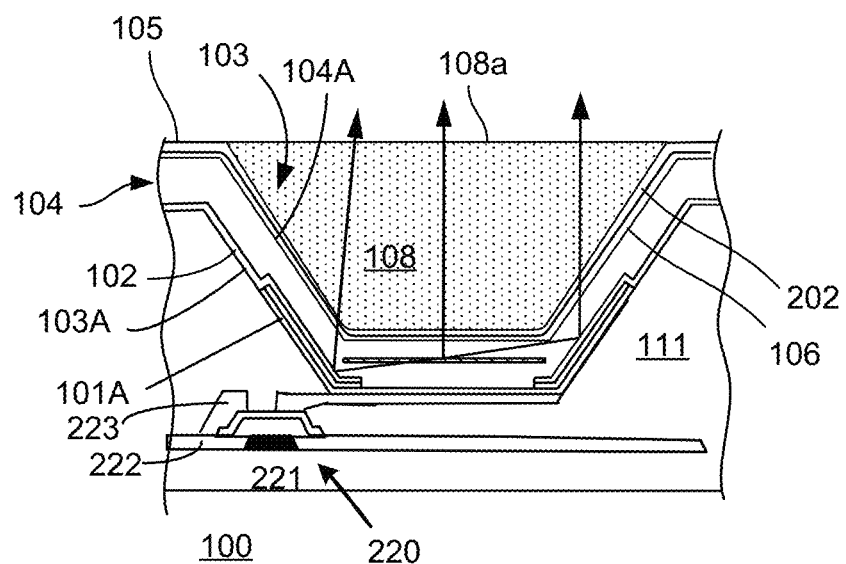
FIG. 2B shows an example of a cross-sectional view of a top emission OLED pixel coupled to a thin film transistor driver.

Further referring to FIG. 2A, a cross-section view of an OLED structure 200A illustrates an UV-blocking layer 202 between the top-surface 104A of the OLED layer 104 and the patterned LEL layer 108. Except as discussed below, the OLED structure 200A can be similar to the OLED structure 100A and 100B discussed with reference to FIGS. 1A and 1B. The OLED structure 200A is formed on a substrate 100 and includes an array of well structures 103, each including the bottom region 103B and sidewall region 103A. The well structures 103 are separated by the plateau 105. As discussed above, the dielectric layer 102 is formed on the slopes of the PDL 111 and extends to the edge area of the bottom region 103B, although extension into the recess bottom region is possible but generally minimized.

The anode 101 is formed in the bottom region 103B and can extend partially up the sidewalls 103A. As noted above, the anode 101 can be reflective, or can be a conductive non-reflective material that is coated with a conductive optically reflective material.

In more detail, the floor of each well structure 103 is a bottom flat surface above substrate 100, which represents the flat top metal surface formed during thin film transistor (TFT) circuit process (such as the metal layer used for source and drain electrode of a thin film transistor TFT). A mirror layer 101M can be formed over anode 101. The mirror layer 101M may use silver (Ag) or other reflective metal. Alternatively, the anode can be a transparent conductive material deposited over a conductive or non-conductive reflective layer. For example, the anode 101 can be a conductive indium tin oxide (ITO) deposited on top of the reflective mirror layer 101M. For an anode of an OLED, internal total reflection is desired.

In some implementations, the anode is limited to the bottom region 103B. In some implementations, the anode also extends partially or fully up the sloped sidewalls 103A of the recess. In some implementations, the mirror layer 101M is a conductive reflective metal that extends onto the sloped sidewalls 103A of the recess. This conductive reflective metal, which is formed on top of the initial anode, can lead to a potential new anode on the bottom/floor region of the pixel. As discussed above, a transparent dielectric layer 102 can be deposited and patterned to eliminate electrical excitation and light emission from the sidewall region 103A.

The cathode 106 can be a continuous layer that is unpatterned and transparent. In a top emitting configuration, the light extraction layer (LEL) 108 is on top of the UV-blocking layer 202, which, in turn, is on top of the cathode 106. In this configuration, a passivation layer can be deposited on the capping layer (CPL) layer which is right above the cathode 106.

As illustrated in, for example, FIGS. 1A to 1C, the LEL layer 108 is disposed over the OLED stack 104 and top cathode 106. The LEL layer 108 at least partially fills each well. In some implementations, the LEL layer 108A "overfills" the well so as to form a convex top surface 109 that projects above the top surface of the plateaus 105.

Between the top surface 104A the OLED layer stack 104 and the patterned LEL 108 is a UV-blocking layer 202. The UV-blocking layer 202 can be formed with a similar process used for forming an OLED layer (such as physical vapor deposition), or by a different process (such as chemical vapor deposition). The UV blocking layer 202 can also be formed by a coating method, e.g., spin-coating. The UV blocking layer 202 has strong absorption at the UV wavelength used for processing the LEL layer 108/108a (e.g., at least 90% to 100% absorption). The UV-blocking layer 202 can be relatively thin, e.g., 50 to 500 nm thick. Examples of materials for the UV blocking layer 202 can be found below. The desired process for depositing the UV blocking layer may depend on the material chosen. In general, an evaporative process can be advantageous because sputtering or chemical vapor deposition (CVD) may lead to additional device damaging elements (for example, plasma in sputtering, contaminants and possibly plasma in CVD/PECVD).

Although a passivation layer can be deposited on the CPL layer, in some implementations the UV blocking layer also functions as the passivation layer and a separate passivation layer on the CPL layer is not required. In this case, the UV blocking layer can function as permeation blocking layer for the potential wet LEL deposition, like ink jet printing (IJP).

The descriptions below provide more details on the methods of forming the mirror and lower electrode, as well as the pixel-defining dielectric layer, with low cost materials and by an integrated process. Further referring to FIG. 2B, the cross-section of an example of an active-matrix display pixel in a top emission OLED display is shown. The TFT pixel driver 220 includes a gate 221, a gate insulator 222 and a source/drain channel 223. The pixel driver 220 is disposed on top of substrate 100. The top-emitting OLED structure 200A is disposed above the TFT pixel driver 220. As illustrated, the lower electrode (e.g., anode) 101 is connected through a via-hole (not shown) to the TFT driver 220, e.g., to the drain. The via-hole runs through the planarization layer underneath the lower electrode (anode) 101. The via-hole is in area out of the emitter element defined by the opening of a dielectric coating 102 over the bottom, reflective mirror 101M. The organic stack 104 including the emitting zone 107 and the transparent top common electrode 105 represents a continuous layer. A transparent filler material 108 filling into each concave well 103 improves out-coupling of the emitting light.

The PDL 111 with tapered sidewalls 103A defines a mirror structure (e.g., shown as 101M in FIGS. 1A to 1C) surrounding the emitting diode area (e.g., from underneath). To achieve such an OLED with improved external efficiency, two more lithography patterning process steps can be used—one for fabricating the patterned mirror layer (e.g., layer 101M in FIGS. 1A to 1C) and one for fabricating the patterned dielectric layer (e.g., layer 102 in FIGS. 1A to 1C). Such a two-step process can reduce yield, e.g., due to mismatch of the patterns of the mirror layer and dielectric layer. However, the lithography patterning process can be simplified while still improving throughput and yield and reducing manufacturing cost, as explained in more detail below.

In one example, a processing method with a single deposition and lithography patterning step is performed to fabricate the reflective bottom pixel electrode (e.g., electrode 101 in FIGS. 1A to 1C) and the surrounding mirror (e.g., layer 101M in FIGS. 1A to 1C). The dielectric coating 102 over the mirror area is based upon surface oxidation of the metal mirror (e.g., layer 101M in FIGS. 1A to 1C) underneath with optical index matching to that of the organic stack layers sandwiched between the top electrode 106 and lower electrode 101.

The self-alignment nature of the forming method in the present disclosure can eliminate a photolithography process (and thus the corresponding yield loss on mask alignment and etching). The self-aligned structures and methods described in the present disclosure can reduce the dimension of the concave wells, thus allowing OLED display with higher pixel densities.

The advantages also include high pixel density, small pixel pitch top emitting OLED pixel with bottom of the OLED emitter residing directly over drain electrode of the power TFT. Such advantageous configuration achieves high efficiency of converting electrical energy to optical energy and improves pixel density for AMOLED displays beyond the density level for phone displays such that applications for augmented reality/virtual reality (AR/VR) become feasible.

Figure 3A:
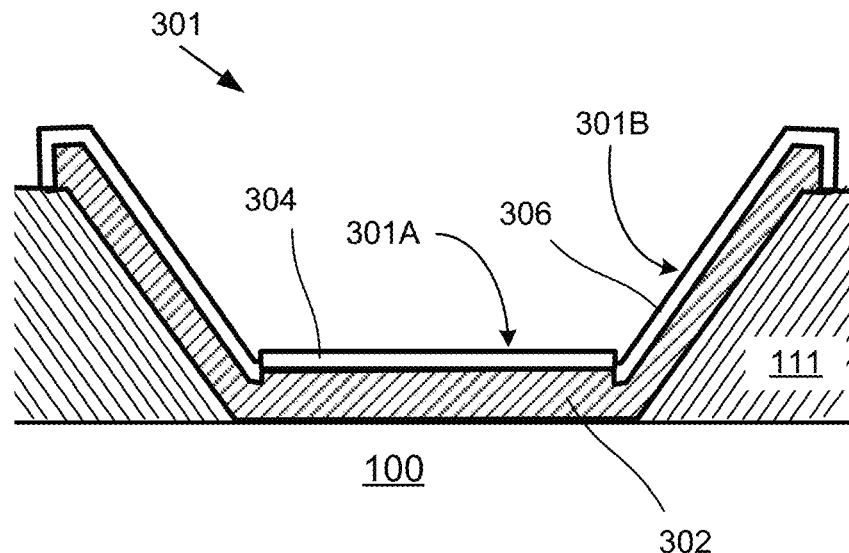
FIG. 3A shows a cross-sectional view of an OLED pixel having a lower electrode and surrounding mirror.

Further referring to FIG. 3A, an example of a bottom pixel electrode structure 300 according to some implementations is shown. In this example, the lower electrode 301A can be constructed over the TFT backpanel (for example, TFT backpanel 220 shown in FIG. 2A). A well structure 301 with a flat bottom 301A and oblique side walls 301B can be made with either organic or inorganic dielectric materials, or a combination thereof. For the well structure 301 to be made with an organic dielectric material, a photo-patternable polymer (photoresist) can be used directly. The thickness of the flat bottom 301A can be in range of 0.5 μm to 5 μm. In one case in which the flat bottom 301A is made with organic materials, the thickness chosen is in range of 2-4 μm. The well structure 103 can also be made with a stack of organic and inorganic layers, for example, a photo-patternable polymer (e.g., Toray 4000 series, DL1000 series, or equivalents) can be used for the top layer (e.g., top layer 105 as shown in FIG. 2A) and can also be used as the built in mask for patterning an inorganic dielectric layer (e.g., dielectric layer 102 as shown in FIG. 2A) underneath (e.g., SiN, SiON, $SiO_2$ or a stack thereof).

A mirror 302 is disposed over the well structure 301, but underneath both a conducting electrode 304 on the bottom 301A of the well and a surface oxidized mirror protector 306 on the oblique side walls 301B. An oxidizable metal with high optic reflectivity in visible spectral range (e.g., Al, AlNd, Ti, or a metal stack thereof) can be used as the mirror 302. The patterning of the bottom pixel electrode is used as the built in mask during the oxidation process. The oxidized metal, e.g., aluminum (or aluminum alloy), in the side-wall area 301B is passivated, thus forming the pixel defining dielectric layer (see dielectric layer 102 in FIGS. 1A and 1B).

Such structure and the materials chosen can be more advantageous for the OLED with high light extraction efficiency as described above in association with FIGS. 1A to 1C and FIG. 2A. In some cases, the mirror layer 302 is mainly formed of aluminum or an aluminum alloy. For example, the mirror layer 302 can be AlNd, with a few percent Nd for improving the processability with post deposition processes. Al has high optic reflectivity over entire visible spectrum range. Such materials possess higher optical indices (both n and k, with examples below) that enable a near perfect mirror with thinner metal thickness (e.g., around 100 nm) and close to 100% optic reflectivity over entire visible range. The surface of the mirror layer 302 can be oxidized with simple low temperature processes. Such an oxidized surface can provide a refractive index matching that of the organic layers used in the OLED emitter (e.g., n around 1.78 and k around 0). For example, oxidized $Al_2O_3$ has an n at around 1.76 at 700 nm and around 1.79 at 400 nm with monotonic change in between with k at approximately 0.

Figure 3B:
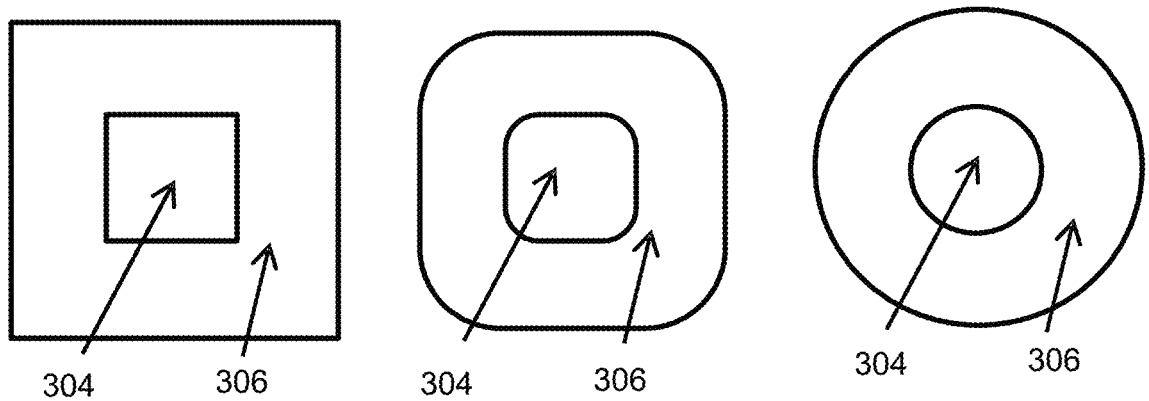
FIG. 3B shows top views of examples of an OLED pixel having a lower electrode and surrounding mirror.

The bottom electrode 304 and surrounding pixel defining dielectric layer 306 can be designed in a variety of shapes. Several possibilities are shown in FIG. 3B, including a square configuration with sharp corners, a square configuration with rounded corners, and a round configuration. In addition to patterns with equal dimensions in x and y directions, patterns with non-equal x and y (such as strip electrode often used in RGB sub-pixel designs) are also possible. The non-equal x and y axis's may also be known as a long axis and a short axis.

The examples of a bottom mirror electrode with a surrounding mirror reflector (as shown above in FIGS. 3A to 3B) can be made with one or two mask steps, as explained in more detail below.

Figure 4A:
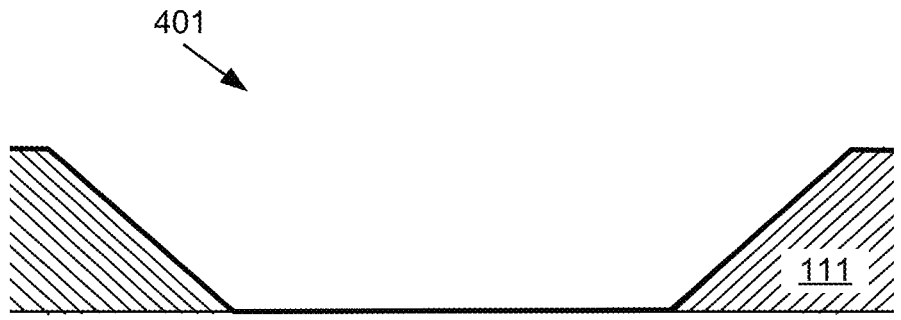
FIGS. 4A to 4D show cross-section views of an example of fabricating a lower electrode and surrounding mirror in an OLED pixel according to some implementations of the present disclosure.

FIGS. 4A to 4D illustrate an example of the mask process for fabricating a bottom mirror electrode with the surrounding mirror reflector according to some implementations. FIG. 4A shows an example of the well structure 401 built with an organic or an inorganic dielectric or their combination in a stack over a substrate 400. Such a well structure 401 can be achieved with a single mask step. In some cases, when a photo-patternable polymer is used for PDL layer 111, the polymer can be used directly for constructing such a well structure 401. Examples of photo-patternable materials include Toray 4000 or 1000 series, or JSR series. When a non-photosensitive dielectric (either organic or inorganic or both) is used, a classic photoresist can be coated over the dielectric, exposed and developed with exposed area over the well structure 401. The well structure 401 can then be formed by etching process with either wet etching step or dry etching step.

Figure 4B:
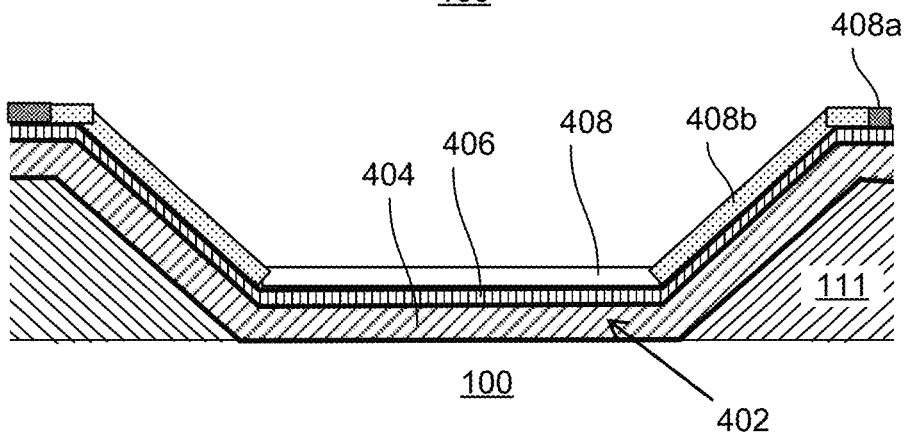
Figure 4C:
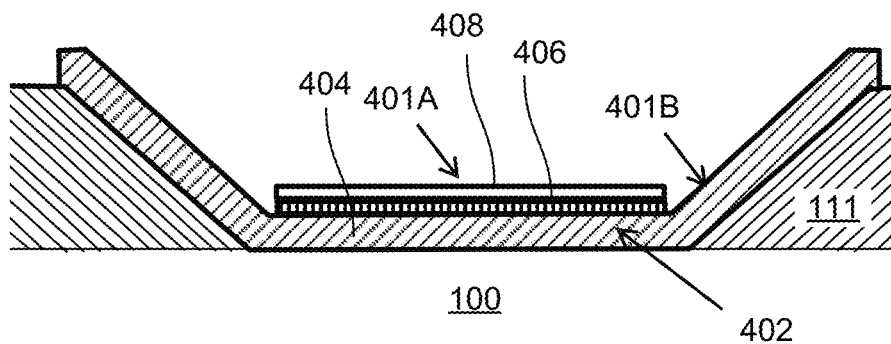
Figure 4D:
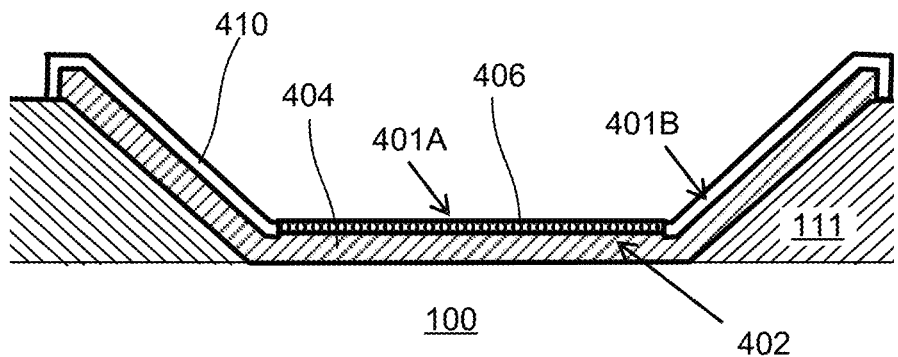

The metal stack used for forming the mirror 402 and lower electrode in area 401A includes two metal layers which can be deposited in sequence, as illustrated in FIG. 4B. FIG. 4C shows an example in which the mirror structure 402 is formed after deposition and patterning. The metal stack can include, for example, a lower metal layer 404 formed of a high reflectivity Al or Al alloy such as AlNd, AlSi, and an upper metal layer 406 formed of a thin conducting metal oxide (TCO) such as ITO (In—Sn—O), AZO (Al—Zn—O), GZO (GaZnO), TZO (Sn—Zn—O), IZO (In—Zn—O). The metal layers 404, 406 can be blanket deposited, e.g., with DC, pulsed or AC sputtering at room temperature. Deposition of the metal stack is followed by a step of oxidizing the top surface of the metal stack. Coatings processed without substrate heating and with amorphous or amorphous/nanocrystalline morphology can be used directly. Such processes can also be used by TFT manufacture lines for metal and pixel electrode process.

In addition to the earlier-mentioned two-mask process steps, the mirror structure 402 with different surface zone shown in FIG. 4C can be fabricated with a single-mask lithography process with a 2-tone (also referred to as halftone or dual tone) mask and a suitable photoresist. In particular, a photoresist layer 408 can be deposited over the metal stack. The photoresist layer 408 is exposed in a single lithography step using the two-tone mask to be developed by a first amount (caused by the first tone pattern of the two-tone mask) over regions 408a outside the well 401 and to be developed by a second, lower amount (caused by the second tone pattern of the two-tone mask) in regions 408b over the side wall region 401B. The region of the photoresist over the bottom portion 401A need not be patterned.

The photoresist that was developed by the first amount is stripped to expose the underlying metal stack in the regions outside of the well 401. This patterned photoresist layer is then used as a mask to etch and remove the portion of the metal stack (both the metal lower layer 404 and metal layer 406) outside of the well. Next, the photoresist that was developed by the second amount is stripped to expose the underlying metal stack in the regions on the side wall area 401B while leaving a portion of the photoresist covering the metal stack on the bottom 401A of the well 401. Using the remaining photoresist as a mask, the upper metal layer 406, which provides the transparent conducting oxide (TCO) layer, is removed by either a wet etching method or a dry etching method in the exposed area on the side walls 401B of the well. The portion of the photoresist covering the metal stack on the bottom 401A of the well serves as a mask to prevent etching of the upper metal layer 406. The photoresist can be removed in the various steps above by oxygen plasma (e.g., dry stripping) process or wet stripping processes. Because a single mask is used, the danger of misalignment of the lower metal layer 404 and upper metal layer 406 is reduced or eliminated, thus improving yield.

This example of a 2-tone lithography process can also be used for TFT source/drain and channel forming process in TFT manufacturing lines. Continuous oxygen plasma treatment after TCO removal in the side-wall area 401B can result in the oxidation in the side wall area 401B along with the removal of remaining photoresist in the bottom area 401A and opening up the conducting pixel electrode for OLED.

An example of thickness for Al is 100 nm. Other examples of thicknesses in the 50 nm-200 nm range can also be chosen depending on the detailed display design and product specifications. An example thickness for the TCO layer is 10 nm. Other examples of thickness in the range of 5-30 nm can also be chosen.

The TCO layer in the bottom area 401A adopted in this lower electrode design can result in the illustrated small steps in areas bordering the side-wall area 401B, which can eliminate the need of other bank structures covering the edge of the mirror 402.

The high extinction coefficient of aluminum mirror allows for thin Al thickness. Moreover, the etching process for a tapered edge at the outer edge of area that corresponds to edge of the metal lower layer 404 can mitigate step coverage issues at these edges.

As illustrated in FIG. 4C, the photoresist 408 covering the bottom area 401A can be kept during a subsequent surface oxidation process. With the top surface covered, as illustrated in FIG. 4C, the surface oxidation process can proceed to form the dielectric passivation layer 410 on the side walls. Thereafter the photoresist 408 can be stripped.

The surface oxidation can use one of the following processes or a combination thereof:
1. Thermal oxidation. Native oxidation at room temperature can result in 3-7 nm oxidized passivation for all the exposed aluminum area. Oxidation at elevated temperature can increase the oxidation layer to 10 nm.
2. Oxygen plasma. When a thicker oxidation layer is preferred, plasma under $O_2$ or mixed air including $O_2$ can be used to achieve an oxidation layer more than 50 nm.
3. Liquid oxidation. By merging the exposed aluminum surface in a liquid oxidant (such as $H_2O_2$ or other oxidant chemicals), a dense oxidation layer can be created at exposed aluminum surface.
4. Anodization. When merging the electrode into anodization bath and placing an anodization current through the electrode, as shown in FIG. 4B and an opposite-polarity electrode being made (not shown), a dense oxidation layer can be formed at the exposed Al surface. Examples of current can be chosen between 0.2-2 mA/cm$^2$. However, pinhole-free oxidized film can be formed with low anodization current density down to the range of microamp/cm$^2$. In some cases when the biasing voltage can reach 8V, the thickness of the oxidation layer reaches about 10 nm. The oxidized layer at the voltage can be further sealed till the oxidation current is reduced to a threshold level (such as below 1% of the initial current). Practically, a variety of electrolyte/water solutions can be used for the anodization process. Examples of the electrolytes used in water-based solution include citric acid or/and ammonium tartrate. For example, ammonium tartrate in deionized (DI) water is about 3.7% by weight. Adding ethylene glycol in 1:10 ratio can sometimes be used to further improve film dielectric properties. Anodized pin-hole free $Al_2O_3$ film can also be made with a solution including a weak inorganic acid (such as Boric acid), and/or an inorganic salt, example include 30% (by weight) ammonium pentaborate ($NH_4B_5O_8$) in ethylene glycol.

As an example, in one design, 120 nm Al layer is blanket deposited at room temperature with DC sputter with less than 10% thickness variation over entire glass substrate. In this example, 10 nm InZnO (IZO) with In:Zn atomic ratio of 1:1 is deposited at room temperature. After selectively patterning the Al and IZO and forming the surfaces of the bottom area 401A at the center with IZO and the side wall area 401B in surrounding areas with Al, a surface oxidation process is carried out with oxygen plasma (with either an ICP or RIE equipment) and then with a post thermal annealing for less than, for example, 200° C. and less than, for example, 60 minutes. The second step using thermal oxidation can be replaced with a wet oxidation process such as immersing the substrate into a $H_2O_2$ bath. The volume of oxidized Al-oxide may be about 30-40% larger than that of aluminum and the thickness difference at the boundary between the bottom and side-wall areas 401A and 401B (e.g., the step between bottom area 401A and side-wall area 401B) is reduced 30-40%, from 10 nm to 6-7 nm.

Such a small step at the boundary between the bottom area 401A and the side wall area 401B may not cause any step coverage issue for the OLED array integrated (as described below).

For some OLED displays with side-by-side red, green and blue color elements, the total thickness of the organic stack layers can be in the range of 100-150 nm. Such thin profile with thermal deposition can be very sensitive to the edge coverage of lower electrode. In some designs, to avoid device leakage due to local field, another organic or inorganic dielectric bank layer is added to mask the edge of lower electrode in area 401A. For the cases using an inorganic dielectric, a low temperature PECVD process is often selected to accommodate the existing TFT backpanels underneath. An example of thickness in the range 200-400 nm can be used to achieve sufficient dielectric property, especially when a low temperature (<250° C.) PECVD process is used. The alignment between the additional bank layer to the pixel electrode 401A set a limit to the pixel dimension of lower electrode 401A. The bottom OLED electrode with a passivated optic mirror in surrounding area, as described in the present disclosure, can provide a simplified process with low material and process cost and with high optic and electric property for the high efficiency OLED.

In another example, the conducting lower electrode in the bottom area 501A of the well can be made from a conductive metal oxide film 510, as illustrated below in FIG. 5A to 5D. In particular, a thin metal film 506 is deposited over the lower metal layer 504. Then at least the top-surface of this thin film 506 is oxidized to form a conductive oxide film 510. The oxidation of the metal film to form the conductive metal oxide film 510 that provides the lower electrode can be performed simultaneously with the oxidation process of the surface of the lower metal layer 504 in the side-wall area 501B that forms the dielectric passivation layer 512.

Figure 5A:
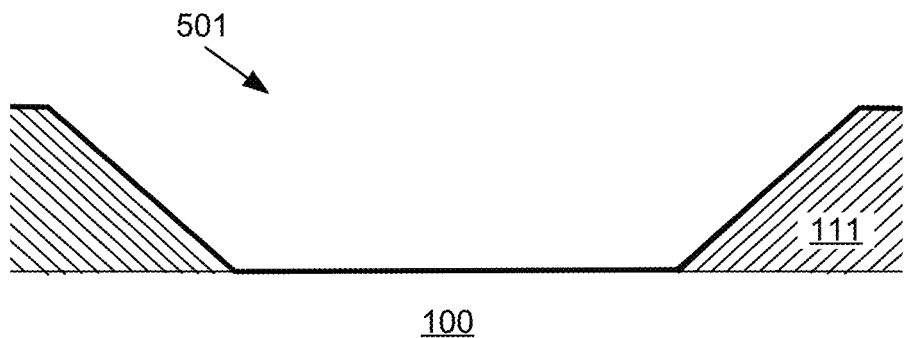
FIGS. 5A to 5D show cross-section views of another example of fabricating a lower electrode and surrounding mirror in an OLED pixel according to some implementations of the present disclosure.
Figure 5B:
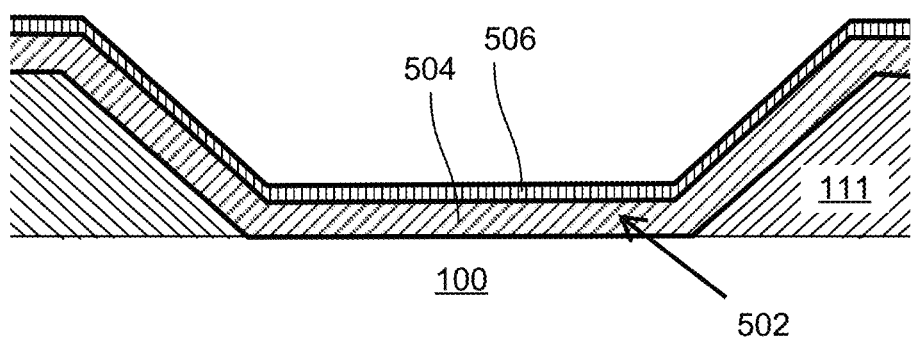

The process flow is similar to that in the earlier example illustrated in FIGS. 4A-4C. The well structure shown in FIG. 5A and the forming method are identical to that used in FIG. 4A. The metal stack used for forming the mirror and lower electrode includes two metal layers which can be deposited in sequence, e.g., with DC sputter at room temperature, as illustrated in FIG. 5B. The first layer 504 can be aluminum, AlNd, or other aluminum alloys. The metal used for the second layer 506 can be a thin metal layer that is oxidizeable in an oxygen environment. In particular, the metal can be selected to preserve sufficient surface conduction after the surface oxidation process to serve as the lower electrode. Metals with such property include In, Zn, Ti, Ta, Sn, Mo, Ni, Nb, Cu, Mg or a metal alloy thereof. The metal layers can be patterned into the shape illustrated in FIG. 5C with a single photo step by means of a half-tone (gray tone) photo process, or by means of standard photolithography with two photo patterning steps, as discussed above in FIGS. 4A to 4D.

Figure 5C:
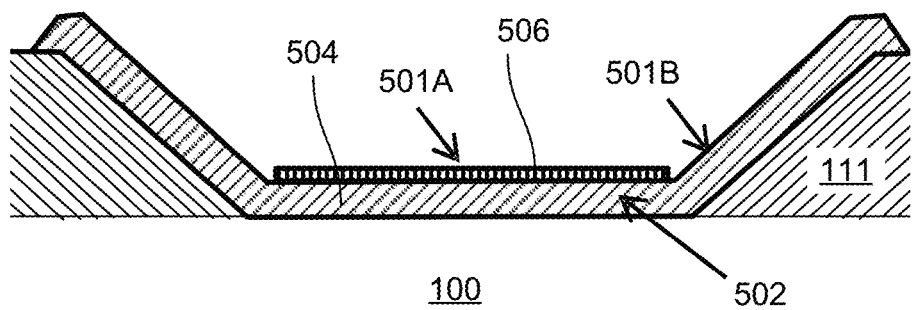
Figure 5D:
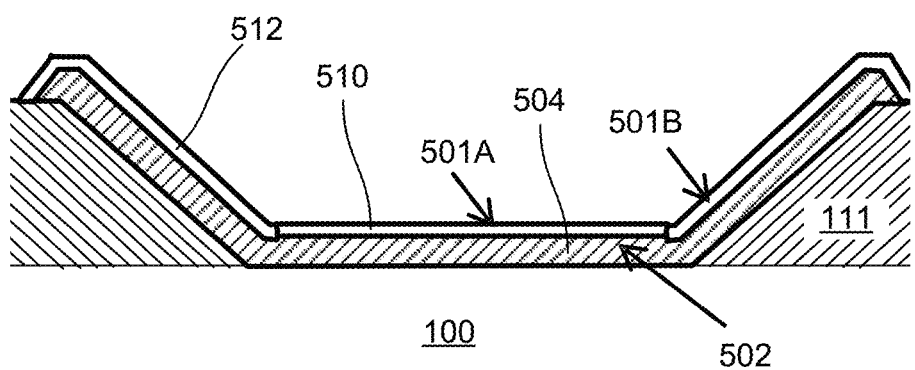

Once the patterning process is completed, the exposed metal surface forms into two zones—the bottom area 501A and the side-wall area 501B in FIG. 5C. With top surfaces exposed, the conducting electrode 510 can be formed in the bottom area 501A and the dielectric passivation layer 512 can be formed in the side wall area 501B. The dielectric passivation layer 512 can be formed with refraction index matching that of the organic stack above, as illustrated in FIG. 5D. In particular, as noted above, the top surfaces of the metal film 506 and the lower metal layer 504 are oxidized, thus forming the conductive oxide film 510 and the dielectric passivation layer 512, respectively.

Notably, the surface resistivity of the lower electrode in the bottom area 501A does not need to be kept within a very low floor level. For example, a metal-oxide with surface conduction below $10^6$ ohm can be used, which results in a serial resistance generally negligible in comparison with the OLED impedance. The surface resistance of the passivation layer in the side wall area 501B in practice does not need to be kept above a very ceiling level. In some cases, a number keeps negligible leakage, say <1° A leakage current under the same OLED biasing condition; can be higher than $10^8$ Ohm. As a reference point, typical surface leakage current of surface oxidized aluminum oxide is <10 nA/cm$^2$ at 10V. For a mirror area 100 μm×100 μm=$10^{-4}$ cm$^2$, the surface resistance is $10^{12}$ ohm, well above the criterion needed.

The thicknesses of the oxidized layers 510 and 512 in the bottom area 501A and side-wall area 501B can be different. In the bottom area 501A, it may be advantageous to set the boundary between the oxidized layer 510 and the metal underneath within the second metal layer which is conductive in both reduced metal and oxidized metal-oxide forms.

To illustrate, in one design example, 100-150 nm Al and 20 nm Ti are blanket deposited at room temperature with DC sputter (FIG. 5B). After selective patterning the Al and Ti to the surfaces of 501A in center with Ti and 501B in surrounding areas with Al, as illustrated in FIG. 5C, a surface oxidation process is carried out with oxygen plasma (with either an ICP or RIE equipment) and then with a post thermal annealing for less than 200° C. for 10-60 minutes. The second step with thermal oxidation can be replaced with a wet oxidation process such as merging the substrate into a bath with liquid oxidant. The bath temperature and merging time can be used to optimize sealing and tuning the final thickness of the oxidized layer.

The effective work function of the doped metal-oxide in 501A area may be built on the work function of the starting metal, and the carrier density of the final metal-oxide. For example, n-type metal-oxide such as $ZnO_{2-x}$, $TiO_{2-x}$ has a work function close to 4 eV, $MgO_x$ has work function close to 3.5 eV. In addition to being tunable with number of oxygen vacancies, the carrier density can also be tuned with metal alloying with mix-valance. The later can also be used for tuning the effective work function of the lower electrode for optimizing carrier injection. For a metal oxide used as bottom cathode for the OLED device, lower work function close to that of Li can be achieved by thermally depositing an Li contained organometallic compound (such as Liq) or an inorganic compound including one of the low work metals (such as Li, Cs, Ba, Ca). Example of such metal compounds include LiF, $Cs(CO)_x$). Such materials have been used as electron-injection layer (EIL) in OLED devices.

When metal-oxide in 501A is created from oxidizing Mo, Cu, Ni or one of alloys thereof, the lower electrode 501A functions as an effective hole injection layer through which 10 nm $MoO_x$ can pass efficiently with work function at the 5.3-5.5 eV range. Thus, the bottom reflective conducting electrode with surrounding mirror described in the present disclosure can be used as either anode, or cathode.

Figure 6A:
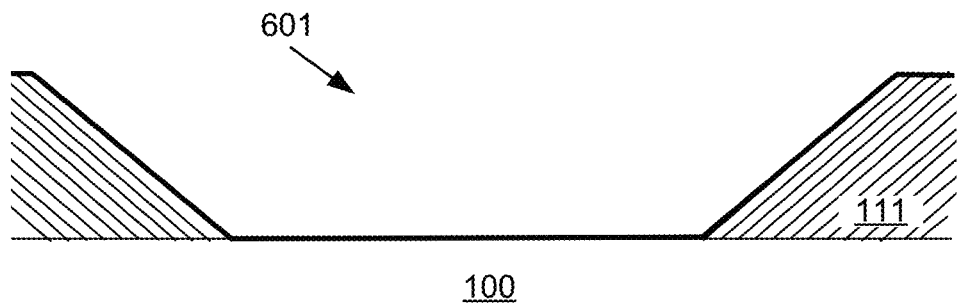
FIGS. 6A to 6D show cross-section views of yet another example of fabricating a lower electrode and surrounding mirror in an OLED pixel according to some implementations of the present disclosure.
Figure 6B:
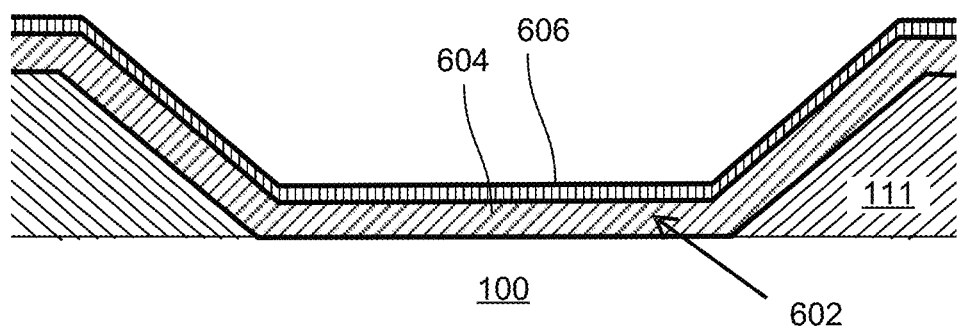
Figure 6C:
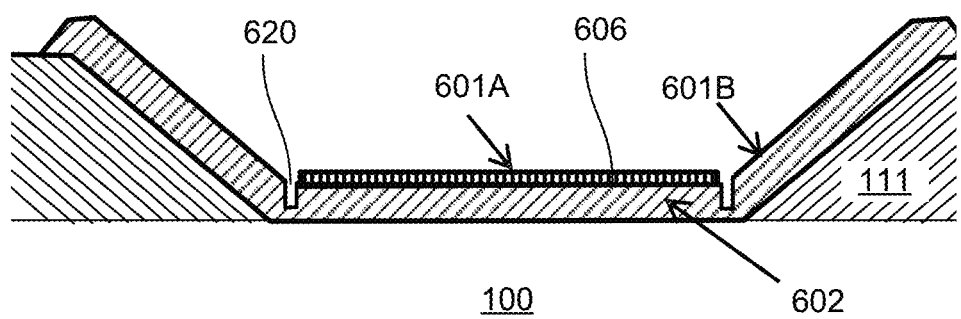
Figure 6D:
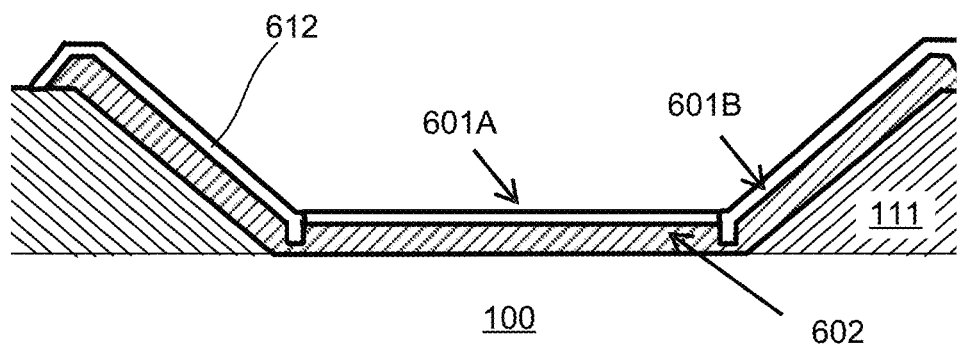

FIGS. 6A to 6D show cross-sectional drawings of yet another example of a fabrication process according to some implementations. In some OLED applications, e.g., in which fast switch speed and low OLED capacitance are desired, a dielectric gap 620 at the boundary between the bottom area 601A and the side wall area 601B can be advantageous to reduce the capacitance associated with the OLED pixel emitter. Such structure can be achieved with a self-aligned etching and post surface oxidation as shown in FIG. 6C.

No additional lithography patterning process is needed in this example. Specifically, steps for FIG. 6A and FIG. 6B are the same as in FIGS. 4A-4B and FIGS. 5A-5B. However, metal materials for the bottom metal layer 604 and top metal layer 606 with different electrochemical potentials can be selected. During the etching process as shown in FIG. 6C, a wet etchant can be selected so that a galvanic effect is leveraged to etch the bottom metal layer 604 near the boundary of 601A/601B away partially or completely.

After the surface oxidation process as described above in association with FIGS. 4D and 5D, the top surface in the exposed side-wall area 601B, including in the gap near the 601A/601B boundary, can be fully sealed with a metal oxide layer 612, e.g., with $Al_2O_3$. The mirror in the side wall area 601B may not contribute to pixel capacitance. Thus, the examples illustrated by FIGS. 4A-4D, 5A-5D, and FIGS. 6A-6D provide a bottom mirror electrode with different OLED capacitance, thereby providing flexibility for different pixel circuit designs serving for different application specifications.

The conductivity range and optical reflectivity of the layers in the bottom area 501A and side-wall area 501B discussed above in association with FIGS. 5A to 5D are generally applicable to all implementations described in the present disclosure. As discussed above in association with FIGS. 4A to 4D, the bottom mirror electrode can be used for either an anode or a cathode, by selecting corresponding metal oxide for 401a. For example, $TiO_x$, $TaO_x$, $CsO_x$ can be used for cathode while $MoO_x$ or $NiO_x$ can be used for anode contact. As discussed above in association with FIGS. 1A to 1C, 2A to 2C, and 3A to 3B, the oxidized $Al_2O_3$ made by surface oxidation methods can have refraction index of n from about 1.7 to 1.8 and k at about 0. The dielectric breakdown is typically over 10-20V, sufficient for the AMO-LED device in which the OLED emission elements are operated below 10V.

In addition to configuring the boundary between the lower electrode and the passivation layer being located on the flat bottom of the well, the boundary can also be located in the oblique side wall area. Such a bottom mirror electrode may find usage for certain applications.

The dielectric mirror in the side wall area 401B/501B/601B is self-aligned to the conducting mirror electrode in the bottom area 401A/501A/601A with high quality surface passivation, e.g., by aluminum oxide. Thus such bottom mirror electrode can be achieved with physical dimensions smaller than those from conventional photolithography. Such lower electrode enables top emission AMOLED with high pixel density. For example, with an organic material for forming PDL 111 (see e.g., FIG. 4), the bottom area 401A/501A/601A can be made with dimension of 4 μm×4 μm and the outer dimension of the side wall area 401B/501B/601B can be about 8 μm×8 μm. With an inorganic dielectric, the dimension of the bottom area 401A/501A/601A can be reduced to below 2 μm×2 μm, and the outer dimension of the side wall area 401B/501B/601B can be close to 4 μm×4 μm. Such pixel design enable full color AMOLED with more than 1000 pixel-per-inch (PPI).

Figure 7:
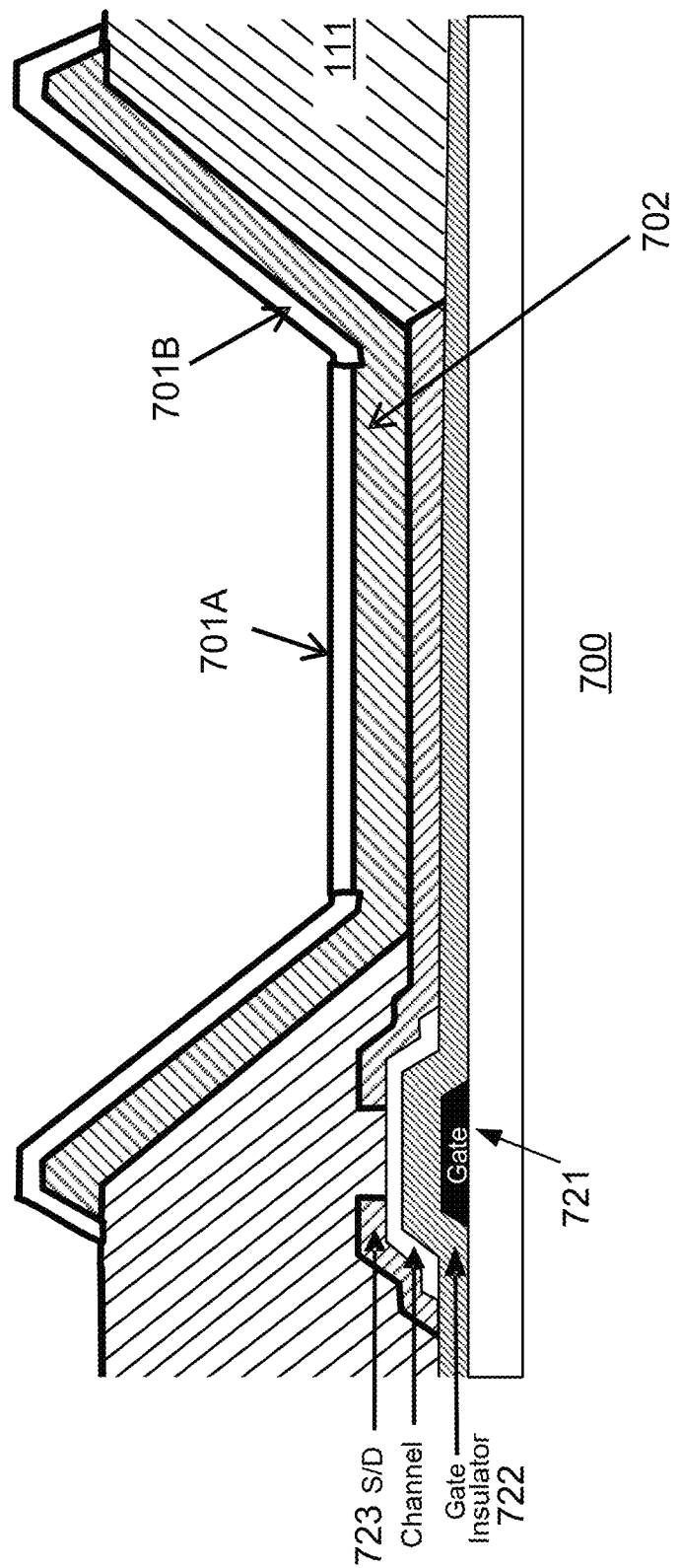
FIG. 7 illustrates an example an OLED pixel fabricated on top of a thin film transistor (TFT) driver according to some implementations of the present disclosure.

In some cases, the bottom OLED electrode for a top emission OLED pixel is disposed over a planarization layer with a via connecting the pixel electrode to a TFT drain electrode of the driving TFT. In these cases, the via is located outside OLED pixel electrode area. The pixel electrode structures disclosed in the present disclosure can, in fact, skip the planarization layer and the via-hole process, and build the lower electrode in the bottom region 401A/501A/601A directly over the drain metal electrode, as shown in FIG. 7 below, saving process steps and pixel space. Such pixel structure can enable top emission AMOLED with higher pixel density.

FIG. 7 shows a top emission AMOLED pixel 701 having a lower electrode in area 701A with surrounding mirrors in sidewall area 701B. The lower electrode in bottom area 701A is located directly above a source or drain electrode metal 723 of TFT 720 that drives the pixel 701. The TFT 720 further includes gate 720, gate insulator 722.

Figure 8A:
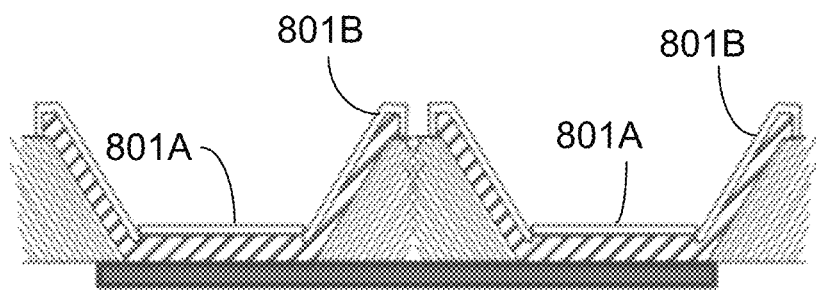
FIG. 8A to 8B show an OLED pixel with multiple base units according to some implementations of the present disclosure.
Figure 8B:
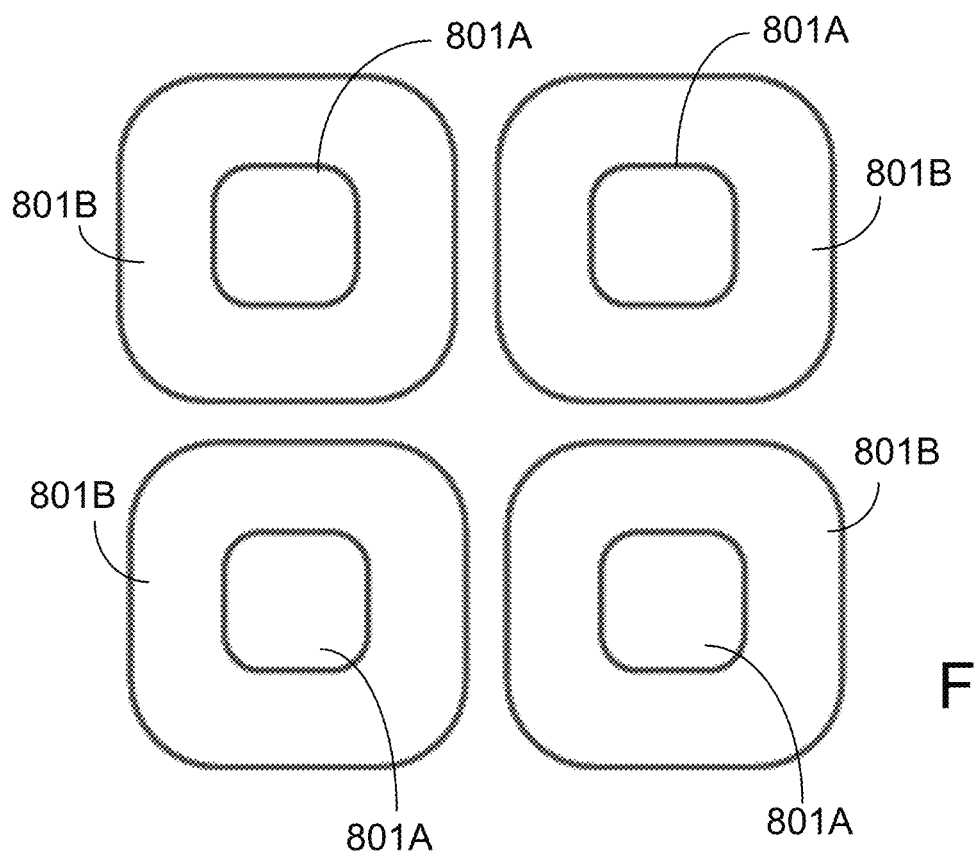

On the other hand, the improvement of the out-coupling with the bottom mirror electrode may depend on a ratio of dimensions of bottom flat area and the dimension of the outer mirror. With the lower electrode processed by means of self-aligned structure, more base units (as shown in FIG. 3B) can be disposed in one OLED display pixel. FIG. 8A to 8B shows one example with four (4) base units in one OLED display pixel. Such design can further improve both the out-coupling efficiency and the color pixel patterning independently. Indeed, the high efficiency top emission OLED design as disclosed in the present disclosure can effective address the demand on OLED emission efficiency using low cost materials, and enabling full-color OLED display with a broad-band emission OLED plus filter set.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method for manufacturing an organic light-emitting diode (OLED) structure, the method comprising:
   depositing a metal stack including a lower metal layer and an upper metal layer over a well structure that defines a pixel of the OLED structure on a substrate;
   performing a lithography process using a two-tone mask to form a two-tone photoresist layer on the metal stack;
   removing portions of the photoresist layer having a first tone to expose regions of the metal stack outside the well structure;
   removing portions of the metal stack outside the well structure using the photoresist layer as a mask;
   removing portions of the photoresist layer having a second tone to expose regions of the metal stack correspond to sidewalls of the well structure;
   removing portions of the upper metal layer on the sidewalls of the well structure while preserving the upper metal layer over areas corresponding to a bottom of the well structure using the photoresist layer as a mask; and
   oxidizing at least one exposed surface such that a lower electrode is created in the areas that correspond to the bottom of the well structure and a dielectric passivation layer is created in an area that corresponds to the sidewalls.

2. The method of claim 1, wherein oxidizing exposed surfaces comprises oxidizing a portion of the lower metal layer on the sidewalls to form the dielectric passivation layer.

3. The method of claim 2, wherein the photoresist layer blocks oxidation of a portion of the upper metal layer over the bottom of the well structure.

4. The method of claim 3, comprising stripping the photoresist layer from a region over the bottom of the well structure to expose the upper metal layer after the oxidizing, the upper metal layer providing the lower electrode.

5. The method of claim 2, comprising stripping the photoresist layer from the region over the bottom of the well structure to expose the upper metal layer before the oxidizing.

6. The method of claim 5, wherein the oxidizing oxidizes the upper metal layer to form a conductive metal oxide, the conductive metal oxide providing the lower electrode.

7. The method of claim 1, further comprising depositing an OLED stack at least over the lower electrode, and at least partially filling the well structure with an index matching filling material to provide a light extraction layer in the well structure.

8. The method of claim 7, wherein the light extraction layer and the dielectric passivation layer have matching indexes of refraction.

9. The method of claim 1, comprising, after exposing the regions of the metal stack correspond to sidewalls of the well structure, removing a portion of the lower metal layer at an outer edge of the upper metal layer.

10. The method of claim 9, wherein removing the portion of the lower metal layer at the outer edge of the upper metal layer comprises wet etching during removing portions of the upper metal layer on the sidewalls of the well structure.

11. The method of claim 1, wherein performing the lithography process using the two-tone mask comprises expositing the photoresist layer in a single lithography step.

12. The method of claim 1, comprising removing at least one portion of the photoresist layer using oxygen plasma.

13. The method of claim 1, wherein lower metal layer is aluminum, AlNd, or an aluminum alloy.

14. The method of claim 13, wherein the upper metal layer is In, Zn, Ti, Ta, Sn, Mo, Ni, Nb, Cu, Mg or a metal alloy thereof.

15. The method of claim 1, wherein the lower metal layer provides a mirror on the sidewalls.

16. The method of claim 1, wherein the lower electrode is created over a metal electrode of a thin film transistor (TFT) driver for a pixel of a display.

17. The method of claim 6, wherein oxidation of the upper metal layer to form the conductive metal oxide is performed simultaneously with the oxidation of the lower metal layer to form the dielectric passivation layer.

\* \* \* \* \*